United States Patent [19]

Brown

[11] Patent Number: 5,077,490
[45] Date of Patent: Dec. 31, 1991

[54] SCHOTTKY-DIODE EMULATOR FOR BICMOS LOGIC CIRCUIT

[75] Inventor: Anthony K. D. Brown, Kanata, Canada

[73] Assignee: Northern Telecom Limited, Montreal, Canada

[21] Appl. No.: 647,794

[22] Filed: Jan. 30, 1991

[51] Int. Cl.$^5$ .............................. H03K 17/16
[52] U.S. Cl. .................. 307/446; 307/570; 307/456; 307/458; 307/475; 307/270
[58] Field of Search ............ 307/446, 456, 458, 475, 307/270

[56] References Cited

U.S. PATENT DOCUMENTS

| | | | |
|---|---|---|---|
| 4,779,014 | 10/1988 | Masuoka et al. | 307/446 |
| 4,985,645 | 1/1991 | Tsutsui | 307/570 |
| 5,001,365 | 3/1991 | Murabayashi et al. | 307/446 |
| 5,017,808 | 5/1991 | Ueno et al. | 307/446 |
| 5,034,628 | 7/1991 | Tatsuzawa et al. | 307/570 |

*Primary Examiner*—Stanley D. Miller
*Assistant Examiner*—Scott A. Ouellette
*Attorney, Agent, or Firm*—Philip W. Jones

[57] ABSTRACT

A BiCMOS logic circuit with Schottky-diode emulator is formed from three NMOS field-effect transistors, a PMOS field-effect transistor, a npn bipolar transistor and a load element. First and second NMOS transistors and the PMOS transistor are connected serially between ground and a positive supply voltage. The input signal to the circuit is connected to the gate of the first NMOS transistor and the gate of the PMOS transistor, each of which sits on an opposite side of the second NMOS transistor. The drain and gate of the second NMOS transistor are connected to each other and to the drain and gate of the third NMOS transistor. The drain of the first NMOS transistor is connected to the base of the npn transistor, which has its collector connected through a load to the supply voltage. The source of the third NMOS transistor is also connected to the collector of the npn transistor. In this circuit, the second and third NMOS transistors act together to provide a feedback to limit the maximum base voltage experienced by the npn transistor when the input signal to the circuit goes low, thereby serving a similar function to that served by Schottky diodes in some bipolar circuits. A complementary circuit may be constructed for use with a negative supply voltage.

7 Claims, 3 Drawing Sheets

SCHOTTKY-DIODE EMULATOR FOR BICMOS LOGIC CIRCUIT

FIELD OF THE INVENTION

The invention relates to a means for emulating a bipolar circuit element on a BiCMOS logic circuit, and more particularly, to a means for emulating a Schottky diode for limiting the voltage on the base of a bipolar transistor of a BiCMOS switching circuit.

SUMMARY OF THE INVENTION

BiCMOS technology refers to the combining of CMOS circuitry with bipolar circuitry to form hybrid circuits having the advantages of both. One trade-off is that the number of process steps required to implement the BiCMOS technology is greater than the number of process steps required to implement either CMOS technology or bipolar technology. An increased number of processing steps is a factor in determining the probability of functional success of a circuit die, i.e. the yield. Simplicity of processing is important for maintaining a good yield, and whenever possible process steps are eliminated. A particular example of a process step which is considered dispensable in BiCMOS circuits is the provision of a Schottky diode device for limiting the base voltage on bipolar transistors. Such diodes are traditionally used in bipolar switching circuits to prevent saturation of switching transistors and the associated long time-constants resulting from such saturation. The subject invention emulates the function of a Schottky diode for the purpose of enhancing bipolar transistor switching speed in BiCMOS technology.

The basic BiCMOS logic circuit of the invention comprises a switching circuit having a CMOS inverter input coupled to a bipolar inverter output. The BiCMOS circuit has a PMOS field-effect transistor, three NMOS field-effect transistors, a npn bipolar transistor and a load element. The PMOS transistor has its source connected to a positive supply voltage and its gate connected to a circuit input voltage. A first NMOS transistor has its source connected to a ground voltage and its gate connected to the circuit input voltage. A second NMOS transistor has its drain and gate connected to the drain of the PMOS transistor and its source connected to the drain of the first NMOS transistor. The bipolar transistor has its base connected to the drain of the first NMOS transistor and it emitter connected to the ground voltage. The load element is connected between the positive supply voltage and the collector of the bipolar transistor. A third NMOS transistor has its drain and gate connected to the drain of the PMOS transistor and its source connected to the collector of the bipolar transistor. The transistors and load element are selected such that, as the circuit input voltage changes to switch the first NMOS transistor off and the PMOS transistor on, both the second NMOS transistor and the bipolar transistor switch on causing a drop in voltage on the collector of the bipolar transistor. That voltage drop causes the third NMOS transistor to turn on. The increased current flow through the third NMOS transistor causes a reduction in current flow through the second NMOS transistor. The second and third NMOS transistors thereby act as a feedback loop to limit the base voltage on the bipolar transistor.

The third NMOS transistor may be eight times as large as the second NMOS transistor. The load element may comprise a resistor. Alternatively, the load element may comprise a circuit with fourth and fifth NMOS field-effect transistors, second and third PMOS field-effect transistors, and a second npn bipolar transistor. The fourth NMOS transistor has its source connected to the ground voltage and its gate connected to the circuit input voltage. The second PMOS transistor has its source connected to the positive supply voltage and its gate and drain connected to the drain of the fourth NMOS transistor. The third PMOS transistor has its source connected to the positive supply voltage and its gate connected to the gate of the second PMOS transistor. The fifth NMOS transistor has its source connected to the ground voltage and its drain connected to the drain of the third PMOS transistor. The second bipolar transistor has its collector connected to the positive supply voltage and its base connected to the drain of the fifth NMOS transistor. The emitter of the second bipolar transistor is connected to the gate of the fifth NMOS transistor and to the collector of the first bipolar transistor.

In a complementary form of the BiCMOS circuit, the positive supply voltage is replaced by a negative supply voltage, the NMOS and PMOS field-effect transistors are replaced by PMOS and NMOS field-effect transistors, respectively, and the npn bipolar transistor is replaced by a pnp bipolar transistor. In this complementary form of the circuit, the transistors and load element are selected such that, as the circuit input voltage changes to switch the first PMOS transistor off and first NMOS transistor on, both the second PMOS transistor and the pnp transistor switch on causing a drop in voltage on the collector of the pnp transistor which in turn causes the third PMOS transistor to turn on. The increased current flow through the third PMOS transistor causes a reduction in current flow through the second PMOS transistor. The second and third PMOS transistors thereby act as a feedback loop to limit the base voltage on the pnp transistor. The third PMOS transistor may be eight times as large as the second PMOS transistor.

BRIEF DESCRIPTION OF THE DRAWINGS

The invention will next be more fully described by means of the accompanying drawings, in which.

DESCRIPTION OF THE PRIOR ART

Figure 1:
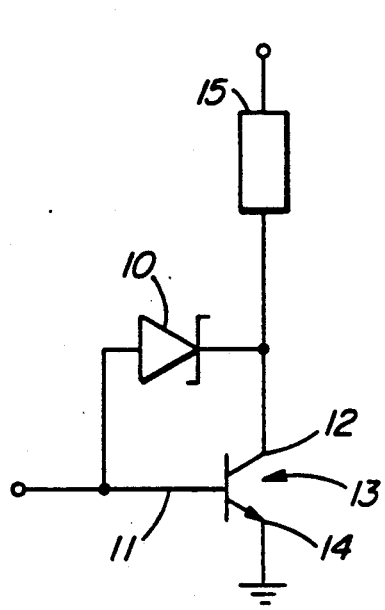
FIG. 1 illustrates the typical application of a Schottky diode to a bipolar transistor for the purpose of preventing saturation of that transistor.

With reference to the prior art shown in FIG. 1, a Schottky diode 10 is positioned between the base 11 and collector 12 of a bipolar transistor generally designated 13 for limiting the voltage on base 11 and thus preventing saturation. In the absence of Schottky diode 10, if sufficient current is sourced into base 11 the collector current of transistor 13 may become sufficiently high that saturation occurs. At that time, the voltage differential between collector 12 and emitter 14 may be as low as 50 millivolts, and the forward-biased junction between collector 12 and base 11 may exhibit an increased junction capacitance with significant charge storage. The time-constant for the switching of transistor 13 correspondingly increases. The Schottky diode 10, added between base 11 and collector 12 of transistor 13, becomes forward-biased at the same time as the junction between base 11 and collector 12 becomes forward-biased. The built-in voltage differential across the junction of Schottky diode 10 is less than that across the base/collector junction of transistor 13, the actual value depending on the type of metal used to construct the Schottky diode. As a result, Schottky diode 10 acts to 'hold up' the voltage on collector 12 and prevents transistor 13 from entering heavy saturation. It should be noted that Schottky diode 10 does not exhibit a large forward-biased capacitance similar to that at the base/-collector junction of transistor 13. Thus the addition of the Schottky diode results in a bipolar transistor having a much faster switching speed. The semiconductor industry has previously made use of Schottky diodes for this purpose.

Figure 2:
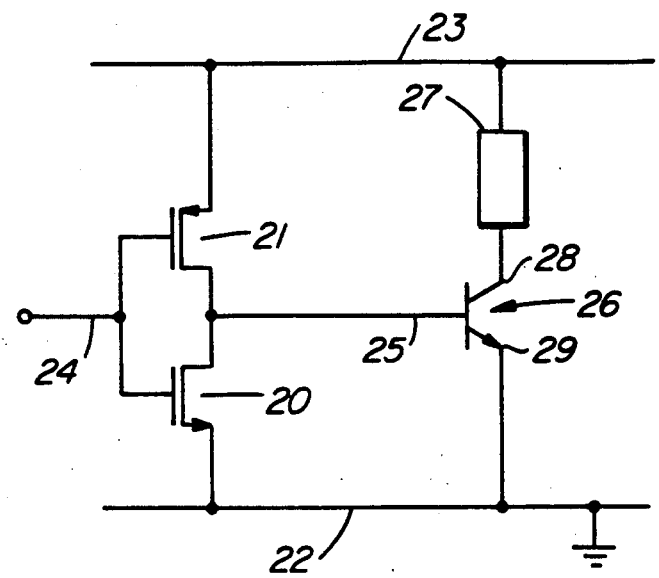
FIG. 2 illustrates a simple BiCMOS switching circuit.

A simple BiCMOS switching circuit is illustrated in FIG. 2. The CMOS portion of the circuit consists of a NMOS field-effect transistor 20 and a PMOS field-effect transistor 21 serially connected between a ground line 22 and a supply line 23. An input line 24 is connected to the gate of transistors 20 and 21, and a line connects the output of the CMOS portion of the circuit to a base 25 of a npn bipolar transistor 26. A load element 27 extends between the collector 28 of transistor 26 and supply line 23, and the emitter 29 of transistor 26 is connected to ground line 22. The load element 27 will be more fully described subsequently. The BiCMOS switching circuit of FIG. 2 has some of the advantages of both CMOS and bipolar technology in that it presents a high impedance to inputs while also providing a low output impedance and a capability of driving highly capacitive loads. One disadvantage of the circuit of FIG. 2 is the large time-constant that is associated with the bipolar transistor 26 in saturation.

DESCRIPTION OF THE PREFERRED EMBODIMENTS

Figure 3:
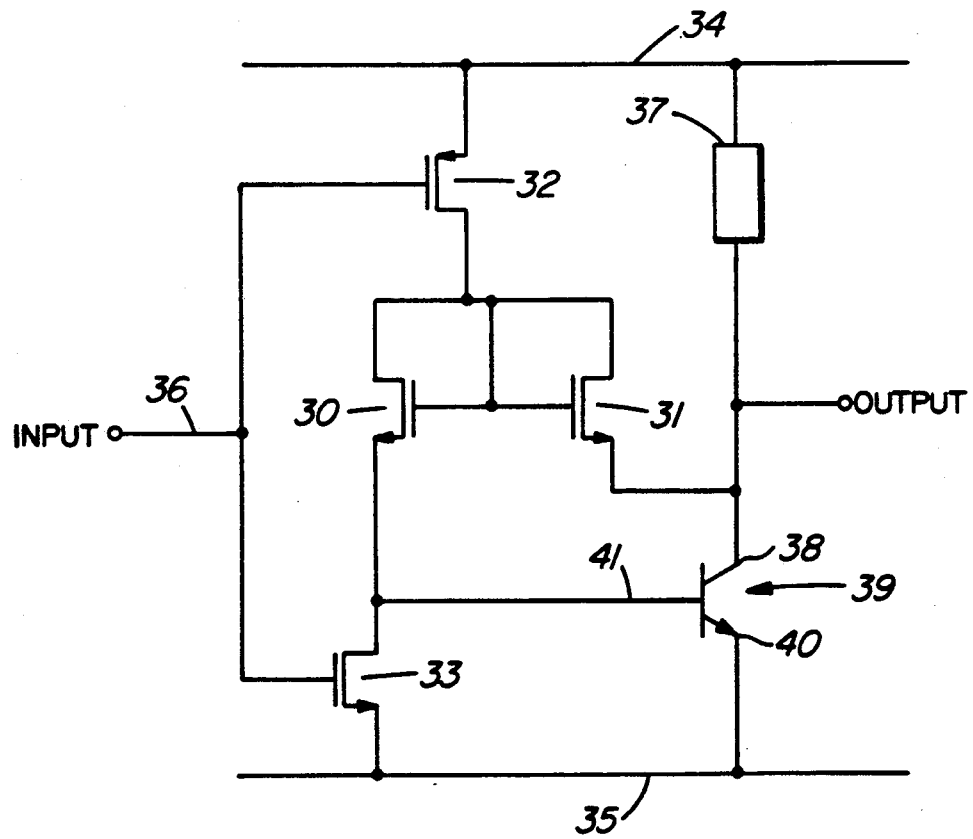
FIG. 3 illustrates the BiCMOS switching circuit of the subject invention.

The BiCMOS switching circuit of FIG. 3 is similar to the circuit of FIG. 2, except that FIG. 3 has an additional pair of NMOS field-effect transistors 30 and 31. Transistor 30 has its drain and gate connected to the drain of a PMOS transistor 32, and has its source connected to the drain of a NMOS transistor 33. The three transistors 32, 30 and 33 are connected to extend in series between a positive supply line 34 and a ground line 35. A circuit input line 36 is connected to the gate of transistors 32 and 33. The gate and drain of NMOS transistor 30 are connected together and also connected to the gate and drain of NMOS transistor 31. Transistor 31 is sized to be eight times as large as transistor 30. Load element 37 is connected between positive supply line 34 and the collector 38 of a npn bipolar transistor generally designated 39. Collector 38 is also connected to the source of NMOS transistor 31. The emitter 40 and base 41 of transistor 39 are connected, respectively, to ground line 35 and to the drain of NMOS transistor 33.

The BiCMOS switching circuit of FIG. 3 operates in the following way. With respect to transistor 30, the drain-to-source voltage is slightly higher than the threshold voltage due to the small reverse bias on the transistor bulk (P-WELL). While the collector 38 of transistor 39 is at a higher potential than base 41, the gate-to-source voltage of transistor 31 is in the sub-threshold region (due to the small reverse bias on the transistor bulk mentioned previously). However, as the potential on collector 38 is drawn below the potential on base 41, the gate-to-source potential of transistor 31 exceeds the threshold potential. Due to the size of transistor 31, that transistor becomes much more conducting than transistor 30. As a result, the transistor 31 robs the base 41 of the current which normally passes through transistor 30, and npn transistor 39 is prevented from entering the region of heavy saturation. The actual final voltage of collector 38 depends upon the size of load element 37, and can be adjusted as desired by appropriate variation of the relative sizes of transistors 30 and 31. In this way the voltage on collector 38 can be adjusted to conform to the normal TTL specification of 0.4 volts when transistor 39 is in the ON state.

Figure 4:
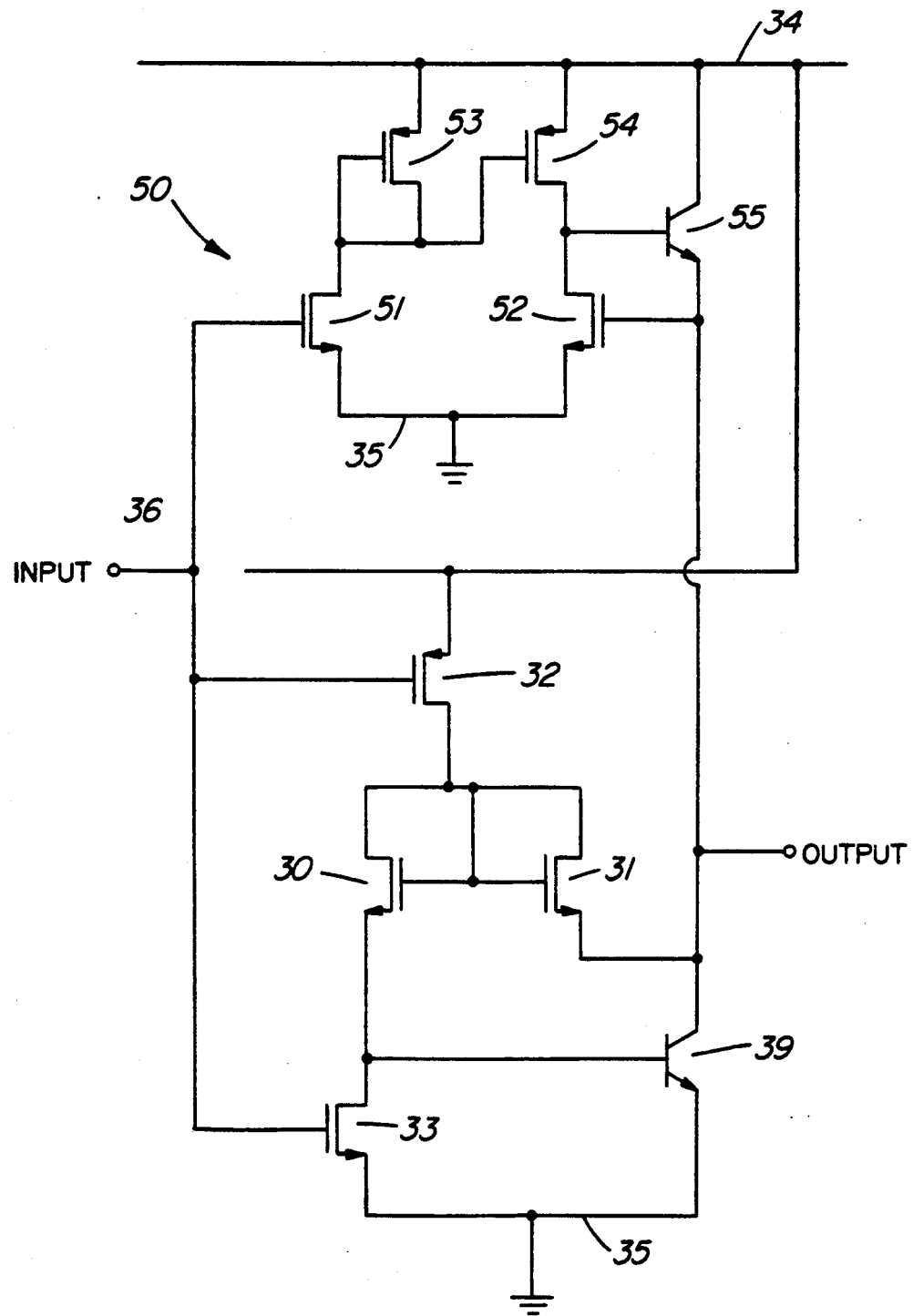
FIG. 4 illustrates the BiCMOS circuit of FIG. 3, with the addition of circuitry for the load element.

FIG. 4 contains the circuit of FIG. 3, and additionally illustrates a BiCMOS circuit generally designated 50 that may be used as a load element for the bipolar transistor. Load element circuit 50 has a pair of NMOS field-effect transistors 51 and 52, a pair of PMOS field-effect transistors 53 and 54, and a npn bipolar transistor 55. The drain and gate of transistor 53 are tied together, and connected to the drain of transistor 51 and to the gate of transistor 54. The source of transistor 51 is tied to ground line 35, and the source of transistor 53 is tied to positive supply line 34. The circuit input line 36 is connected to the gate of transistor 51. The drain of transistor 54 is connected to the drain of transistor 52 and to the base of transistor 55. The source of transistor 52 is tied to ground line 35, and the source of transistor 54 and the collector of transistor 55 are tied to positive supply line 34. The emitter of bipolar transistor 55 is connected to the gate of transistor 52 and to the collector of bipolar transistor 39.

The output voltage of the circuit of FIG. 4 switches between approximately 0.4 volts maximum low voltage and 2.4 volts minimum high voltage, thus meeting the requirements of a TTL driver. The circuit is driven by normal CMOS input signals, with a nominal power supply voltage of 5 volts. The circuit has been shown to achieve propagation delay times of 1.5 nanoseconds in a typical BiCMOS technology when driving a 10 picofarad load. The propagation time for a rising pulse through a circuit not having the Schottky diode emulation circuit exceeded 5 nanoseconds.

Figure 5:
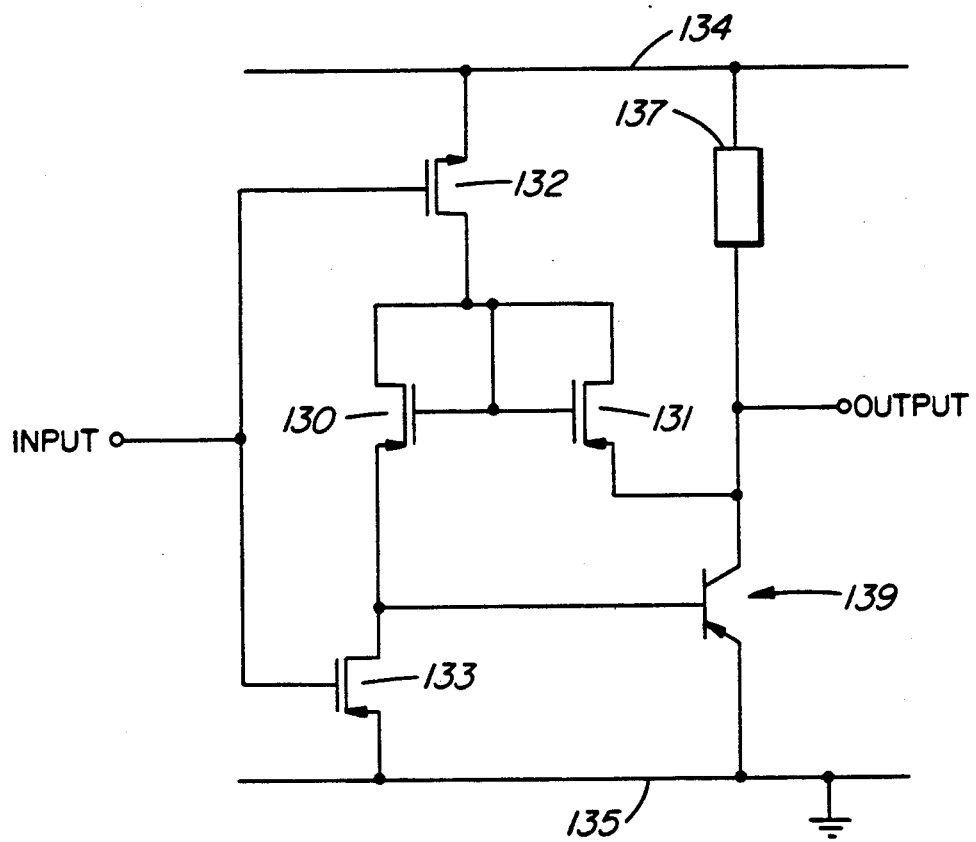
FIG. 5 illustrates a complementary form of the BiCMOS switching circuit of FIG. 3.

FIG. 5 illustrates a complementary form of the circuit of FIG. 3. In this diagram, the PMOS transistor 32 of FIG. 3 has been replaced by the NMOS transistor 132, the NMOS transistors 30, 31 and 33 have been replaced by the PMOS transistors 130, 131 and 133, respectively, and the npn transistor 39 has been replaced by the pnp transistor 139. Positive supply line 34 has been replaced by negative supply line 134, and line 135 represents ground voltage. Load element 137 is the equivalent of load element 37 in the other embodiment. This circuit operates in a complementary manner to the circuit of FIG. 3.

I claim:

1. A BiCMOS logic circuit with Schottky-diode emulator, the circuit comprising:
   (a) a first PMOS field-effect transistor having its source connected to a positive supply voltage and its gate connected to a circuit input voltage;
   (b) a first NMOS field-effect transistor having its source connected to a ground voltage and its gate connected to the circuit input voltage;

(c) a second NMOS field-effect transistor having its drain and gate connected to the drain of the first PMOS transistor and its source connected to the drain of the first NMOS transistor;

(d) a first npn bipolar transistor having its base connected to the drain of the first NMOS transistor, its collector connected to an output terminal and its emitter connected to the ground voltage;

(e) a load element connected between the positive supply voltage and the collector of the first bipolar transistor; and, (f) a third NMOS field-effect transistor having its drain and gate connected to the drain of the first PMOS transistor and its source connected to the collector of the first bipolar transistor, the third NMOS transistor being larger in size than the second NMOS transistor;

whereby the transistors and load element are selected such that, as the circuit input voltage changes to switch the first NMOS transistor off and the first PMOS transistor on, both the second NMOS transistor and the first bipolar transistor switch on causing a drop in voltage on the collector of the first bipolar transistor which in turn causes the third NMOS transistor to turn on, the increased current flow through the third NMOS transistor causing a reduction in current flow through the second NMOS transistor, the second and third NMOS transistors thereby acting as a feedback loop to limit the base voltage on the first bipolar transistor.

2. A logic circuit as in claim 1, wherein the third NMOS transistor is eight times as large as the second NMOS transistor.

3. A logic circuit as in claim 1, wherein the load element comprises a resistor.

4. A logic circuit as in claim 1, wherein the load element comprises:

(a) a fourth NMOS field-effect transistor having its source connected to the ground voltage and its gate connected to the circuit input voltage;

(b) a second PMOS field-effect transistor having its source connected to the positive supply voltage and its gate and drain connected to the drain of the fourth NMOS transistor;

(c) a third PMOS field-effect transistor having its source connected to the positive supply voltage and its gate connected to the gate of the second PMOS transistor;

(d) a fifth NMOS field-effect transistor having its source connected to the ground voltage and its drain connected to the drain of the third PMOS transistor; and, (e) a second npn bipolar transistor having its collector connected to the positive supply voltage and its base connected to the drain of the fifth NMOS transistor, the emitter of the second bipolar transistor being connected to the gate of the fifth NMOS transistor and to the collector of the first bipolar transistor.

5. A BiCMOS logic circuit with Schottky-diode emulator, the circuit comprising:

(a) a first NMOS field-effect transistor having its source connected to a negative supply voltage and its gate connected to a circuit input voltage;

(b) a first PMOS field-effect transistor having its source connected to a ground voltage and its gate connected to the circuit input voltage;

(c) a second PMOS field-effect transistor having its drain and gate connected to the drain of the first NMOS transistor and its source connected to the drain of the first PMOS transistor;

(d) a first pnp bipolar transistor having its base connected to the drain of the first PMOS transistor, its collector connected to an output terminal and its emitter connected to the ground voltage;

(e) a load element connected between the negative supply voltage and the collector of the first bipolar transistor; and, (f) a third PMOS field-effect transistor having its drain and gate connected to the drain of the first NMOS transistor and its source connected to the collector of the first bipolar transistor, the third PMOS transistor being larger in size than the second PMOS transistor;

whereby the transistors and load element are selected such that, as the circuit input voltage changes to switch the first PMOS transistor off and the first NMOS transistor on, both the second PMOS transistor and the first bipolar transistor switch on causing a drop in voltage on the collector of the first bipolar transistor which in turn causes the third PMOS transistor to turn on, the increased current flow through the third PMOS transistor causing a reduction in current flow through the second PMOS transistor, the second and third PMOS transistors thereby acting as a feedback loop to limit the base voltage on the first bipolar transistor.

6. A logic circuit as in claim 5, wherein the third PMOS transistor is eight times as large as the second PMOS transistor.

7. A logic circuit as in claim 5, wherein the load element comprises a resistor.

* * * * *